(12) United States Patent
Takahashi

(10) Patent No.: US 11,017,796 B2
(45) Date of Patent: May 25, 2021

(54) NOISE REDUCTION APPARATUS

(71) Applicant: DENSO TEN Limited, Kobe (JP)

(72) Inventor: Makoto Takahashi, Kobe (JP)

(73) Assignee: DENSO TEN Limited, Kobe (JP)

(*) Notice: Subject to any disclaimer, the term of this patent is extended or adjusted under 35 U.S.C. 154(b) by 0 days.

(21) Appl. No.: 16/826,610

(22) Filed: Mar. 23, 2020

(65) Prior Publication Data
US 2021/0035595 A1  Feb. 4, 2021

(30) Foreign Application Priority Data

Jul. 31, 2019  (JP) .............................. JP2019-141153

(51) Int. Cl.
*G10L 21/0232* (2013.01)
*G10L 25/18* (2013.01)
*H03G 5/16* (2006.01)

(52) U.S. Cl.
CPC .......... *G10L 21/0232* (2013.01); *G10L 25/18* (2013.01); *H03G 5/165* (2013.01)

(58) Field of Classification Search
CPC . G10L 21/0208; G10L 21/0232; G10L 25/18; H03G 3/32; H03G 5/165; H03G 5/025; H03G 5/14; B64C 2220/00; H04R 3/002; H04R 25/554; H04R 3/00; H04R 1/02

USPC ........ 381/91, 92, 94, 94.3, 103, 98, 99, 100, 381/101, 102, 106, 86, 94.9; 379/406.01–406.16; 700/94

See application file for complete search history.

(56) References Cited

U.S. PATENT DOCUMENTS

2016/0322949 A1* 11/2016 Gautama ................ H03G 5/165

FOREIGN PATENT DOCUMENTS

| JP | 2003-218745 A | 7/2003 | |
|----|----|----|----|
| JP | 2003218745 A * | 7/2003 | ............. G10L 11/02 |
| JP | 2004102161 A * | 4/2004 | ............. G10L 11/02 |

* cited by examiner

*Primary Examiner* — Leshui Zhang
(74) *Attorney, Agent, or Firm* — Oliff PLC

(57) ABSTRACT

An equalizer of a noise-reduction apparatus amplifies a predetermined amplification frequency band of a sending sound signal so as to generate an adjustment sending sound signal. A noise estimator estimates a noise included in the adjustment sending sound signal generated by the equalizer so as to generate an estimated noise signal. A noise level adjuster adjusts a level of the estimated noise signal generated by the noise estimator, in a predetermined adjustment frequency band, so as to generate an adjusted noise signal. A noise reducer reduces the noise signal included in the adjustment sending sound signal generated by the equalizer, utilizing the adjusted noise signal generated by the noise level adjuster.

12 Claims, 8 Drawing Sheets

NOISE REDUCTION APPARATUS

BACKGROUND OF THE INVENTION

Field of the Invention

The invention relates to a noise-reduction apparatus that reduces a noise signal included in a sound signal.

Description of the Background Art

A noise-reduction apparatus is included in a handsfree apparatus mounted in a vehicle so as to reduce a noise signal included in a sound signal output from a microphone. The noise signal is caused by, for example, a traveling sound of the vehicle, a sound output from an audio apparatus in a cabin of the vehicle, etc.

In a conventional noise canceler, a flattening equalizer is arranged as a previous step of an adaptive filter and flattens an input sound signal. The adaptive filter reduces the noise signal included in the flattened sound signal. A compensation equalizer emphasizes, in a predetermined frequency band, a component of the sound signal to be output from the adaptive filter so as to cause the sound signal to be output from the adaptive filter to have a frequency characteristic of the sound signal before being input to the equalizer.

More specifically, the compensation equalizer emphasizes, in a low frequency band, the component of the sound signal to be output from the adaptive filter. The compensation equalizer increases an amplification factor for the sound signal as the frequency of the sound signal is lower.

As a result, among the components remaining in the sound signal output from the compensation equalizer, the low frequency component of the signal is emphasized. Therefore, in a case where the low frequency band of the sound signal overlaps a frequency band of a voice of a person, there is a problem that a quality of the sound signal output from the conventional noise canceler decreases.

SUMMARY OF THE INVENTION

According to one aspect of the invention, a noise-reduction apparatus includes: an equalizer, a noise estimator, a noise level adjuster, and a noise reducer. The equalizer amplifies a predetermined amplification frequency band of an input signal so as to generate an adjustment signal. The noise estimator estimates a noise signal included in the adjustment signal generated by the equalizer. The noise level adjuster adjusts a level of the noise signal estimated by the noise estimator, in a predetermined adjustment frequency band, so as to generate an adjusted noise signal. The noise reducer reduces the noise signal included in the adjustment signal generated by the equalizer, utilizing the adjusted noise signal generated by the noise level adjuster.

Therefore, an object of the invention is to provide a noise-reduction apparatus that prevents poor quality of a signal.

These and other objects, features, aspects and advantages of the invention will become more apparent from the following detailed description of the invention when taken in conjunction with the accompanying drawings.

DESCRIPTION OF THE EMBODIMENTS

With reference to the drawings, an embodiment of the invention will be described below. Same numerical references are given to same or equivalent parts/portions, and explanation thereof will be omitted.

[1. Configuration]

[1.1 Configuration of a vehicle-mounted handsfree system 100]

Figure 1:
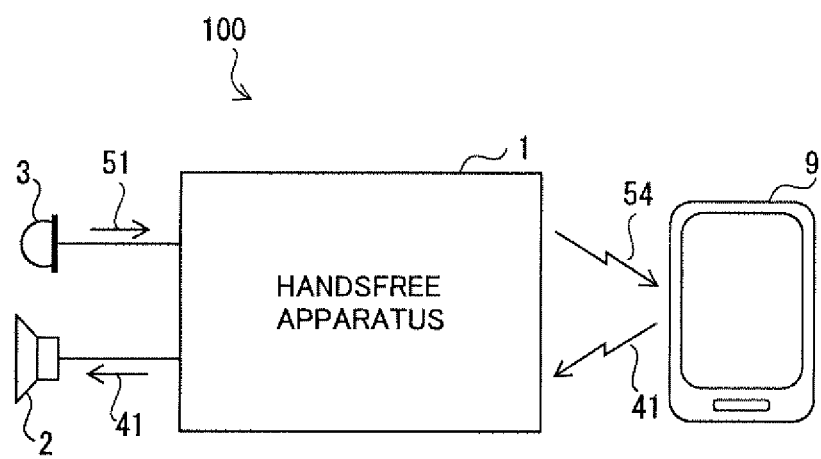
FIG. 1 is a functional block diagram illustrating a configuration of a vehicle-mounted handsfree system of an embodiment of the invention.

FIG. 1 is a functional block diagram illustrating a configuration of a vehicle-mounted handsfree system 100 of a first embodiment of the invention.

As shown in FIG. 1, the vehicle-mounted handsfree system 100 is mounted on a vehicle, such as a car. The vehicle-mounted handsfree system 100 includes a handsfree apparatus 1, a speaker 2, and a microphone 3.

The speaker 2 receives a far-end sound signal 41 from the handsfree apparatus 1 and converts the received far-end sound signal 41 into a sound to output the sound to a cabin of the vehicle.

The microphone 3 inputs a sound in the cabin of the vehicle and generates a sending sound signal 51. The microphone 3 outputs the generated sending sound signal 51 to the handsfree apparatus 1.

The handsfree apparatus 1 receives the far-end sound signal 41 from a smartphone 9, and then outputs the received far-end sound signal 41 to the speaker 2. The handsfree apparatus 1 receives the sending sound signal 51 from the microphone 3, and reduces an echo and a noise included in the received sending sound signal 51. The handsfree apparatus 1 outputs, to the smartphone 9, the sending sound signal 51 having the reduced echo and the reduced noise, as a sending sound signal 54.

The handsfree apparatus 1 includes a noise-reduction apparatus, described later. The noise-reduction apparatus will be mainly described below, and an explanation of a configuration other than the noise-reduction apparatus will be partially omitted.

[1.2. Configuration of the handsfree apparatus 1]

Figure 2:
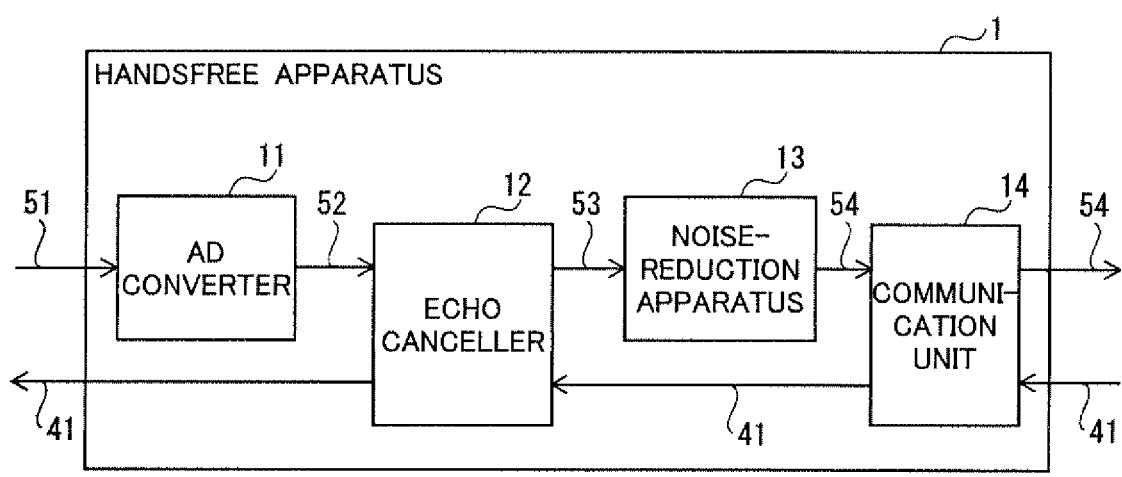
FIG. 2 is a functional block diagram illustrating a configuration of a handsfree apparatus shown in FIG. 1.

FIG. 2 is a functional block diagram illustrating a configuration of the handsfree apparatus 1 shown in FIG. 1. As shown in FIG. 2, the handsfree apparatus 1 includes an analog-to-digital (AD) converter 11, an echo canceler 12, a noise-reduction apparatus 13, and a communication unit 14. The sending sound signals 51 to 54 shown in FIG. 2 include a sound signal and a noise signal. The sound signal here corresponds to a voice of a passenger of the vehicle. The noise signal is a signal of a noise generated due to traveling of the vehicle, a noise in the cabin, an environmental noise, etc.

The AD converter 11 converts the analog sending sound signal 51 input from the microphone 3 so as to generate the sending sound signal 52. The sending sound signal 52 is a digital signal. The AD converter 11 outputs the generated sending sound signal 52 to the echo canceler 12.

The echo canceler 12 receives the sending sound signal 52 from the AD converter 11 and receives the far-end sound signal 41 from the communication unit 14. The echo canceler 12 suppresses the echo included in the received sending sound signal 52 based on the far-end sound signal 41 received from the communication unit 14. The echo canceler 12 outputs, to the noise-reduction apparatus 13, the sending sound signal 52 having the suppressed echo as the sending sound signal 53. Moreover, the echo canceler 12 outputs, to the speaker 2, the far-end sound signal 41 input from the communication unit 14.

The noise-reduction apparatus 13 receives the sending sound signal 53 from the echo canceler 12, and reduces a noise included in the sending sound signal 53. The noise-reduction apparatus 13 outputs, to the communication unit 14, the sending sound signal 53 having the reduced noise as the sending sound signal 54.

The communication unit 14 communicates with the smartphone 9 of a driver of the vehicle via near field wireless communication or via wire communication. Examples of the near field wireless communication are wireless LAN (local area network) and Bluetooth (registered trademark). An example of the wire communication is USB (registered trademark) communication. The communication unit 14 receives the far-end sound signal 41 from the smartphone 9, and outputs the received far-end sound signal 41 to the echo canceler 12. The communication unit 14 receives the sending sound signal 54 from the noise-reduction apparatus 13 and sends the received sending sound signal 54 to the smartphone 9.

[1.3. Configuration of the noise-reduction apparatus 13]

Figure 3:
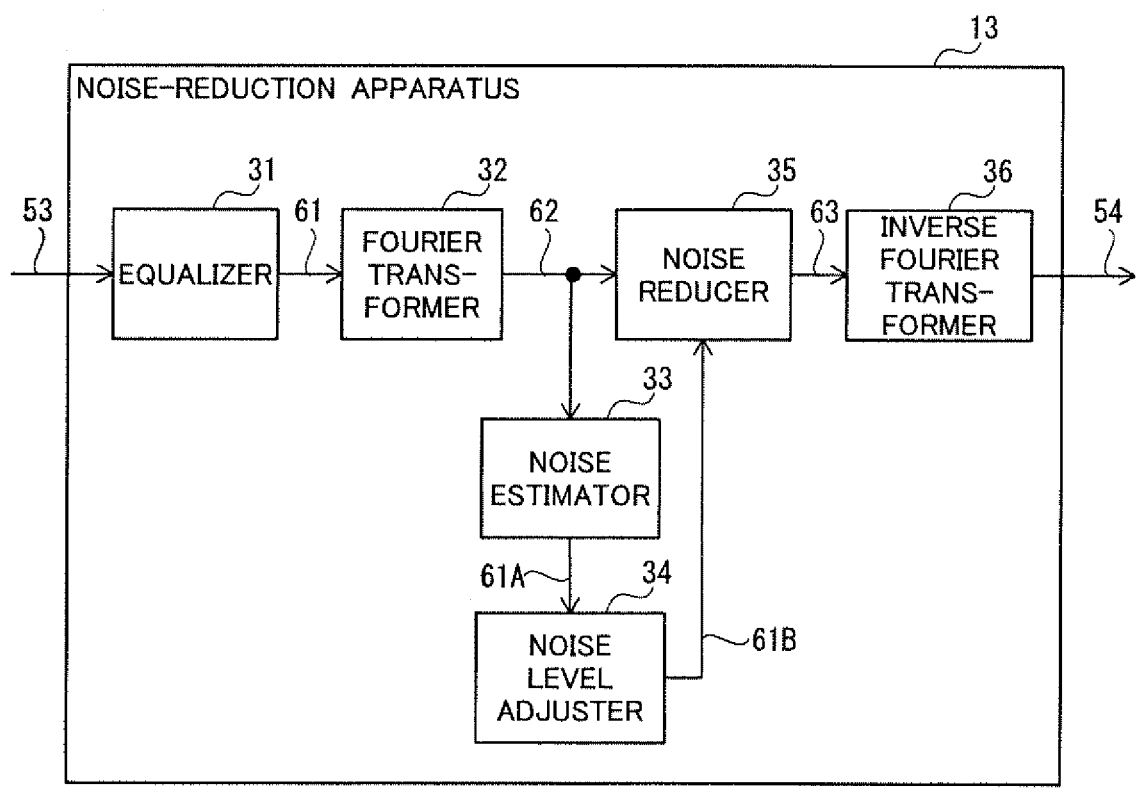
FIG. 3 is a functional block diagram illustrating a configuration of a noise-reduction apparatus shown in FIG. 2.

FIG. 3 is a functional block diagram illustrating a configuration of the noise-reduction apparatus 13 shown in FIG. 2. As shown in FIG. 3, the noise-reduction apparatus 13 includes an equalizer 31, a Fourier transformer 32, a noise estimator 33, a noise level adjuster 34, a noise reducer 35, and an inverse Fourier transformer 36.

The equalizer 31 receives the sending sound signal 53 from the echo canceler 12. The equalizer 31 amplifies a component of the received sending sound signal 53 in a predetermined amplification frequency band so as to generate an adjustment sending sound signal 61. The adjustment sending sound signal 61 includes not only the component of the sending sound signal 54 amplified by the equalizer 31 in the predetermined amplification frequency band but also a component of the sending sound signal 53 in a frequency band other than the predetermined amplification frequency band. The component of the sending sound signal 53 in the frequency band other than the predetermined amplification frequency band is not amplified by the equalizer 31. The equalizer 31 outputs the generated adjustment sending sound signal 61 to the Fourier transformer 32.

In this embodiment, the predetermined amplification frequency band is 1 kHz or lower. The predetermined amplification frequency band is set for the equalizer 31 in advance.

The Fourier transformer 32 receives the adjustment sending sound signal 61 from the equalizer 31, and applies Fourier transformation to the received adjustment sending sound signal 61. The adjustment sending sound signal 61, a time domain signal, is converted into a frequency domain signal via Fourier transformation. The Fourier transformer 32 outputs, to both the noise estimator 33 and the noise reducer 35, the adjustment sending sound signal 61 converted via Fourier transformation as a converted sending sound signal 62.

The noise estimator 33 receives the converted sending sound signal 62 from the Fourier transformer 32, and estimates a noise included in the adjustment sending sound signal 61 based on the received converted sending sound signals 62. The noise estimator 33 outputs an estimated noise signal 61A, a result of the noise estimation, to the noise level adjuster 34. The estimated noise signal 61A is a frequency domain signal.

The noise level adjuster 34 receives the estimated noise signal 61A from the noise estimator 33. The noise level adjuster 34 adjusts a level of a component of the received estimated noise signal 61A in a predetermined adjustment frequency band so as to generate an adjusted noise signal 61B. The noise level adjuster 34 outputs the generated adjusted noise signal 61B to the noise reducer 35.

The noise reducer 35 receives the converted sending sound signal 62 from the Fourier transformer 32, and receives the adjusted noise signal 61B from the noise level adjuster 34. The noise reducer 35 reduces a noise included in the converted sending sound signal 62, utilizing the received adjusted noise signal 61B. The noise reducer 35 outputs, to the inverse Fourier transformer 36, the converted sending sound signal 62 having the reduced noise as a noise-reduced sending sound signal 63.

The inverse Fourier transformer 36 receives the noise-reduced sending sound signal 63 from the noise reducer 35, and applies inverse Fourier transformation to the received noise-reduced sending sound signal 63. Thus, the noise-reduced sending sound signal 63, a frequency domain signal, is converted into a time domain signal. The inverse Fourier transformer 36 outputs, to the communication unit 14, the noise-reduced sending sound signal 63 applied with inverse Fourier transformation, as the sending sound signal 54

[1.4. Configuration of the noise level adjuster 34]

Figure 4:
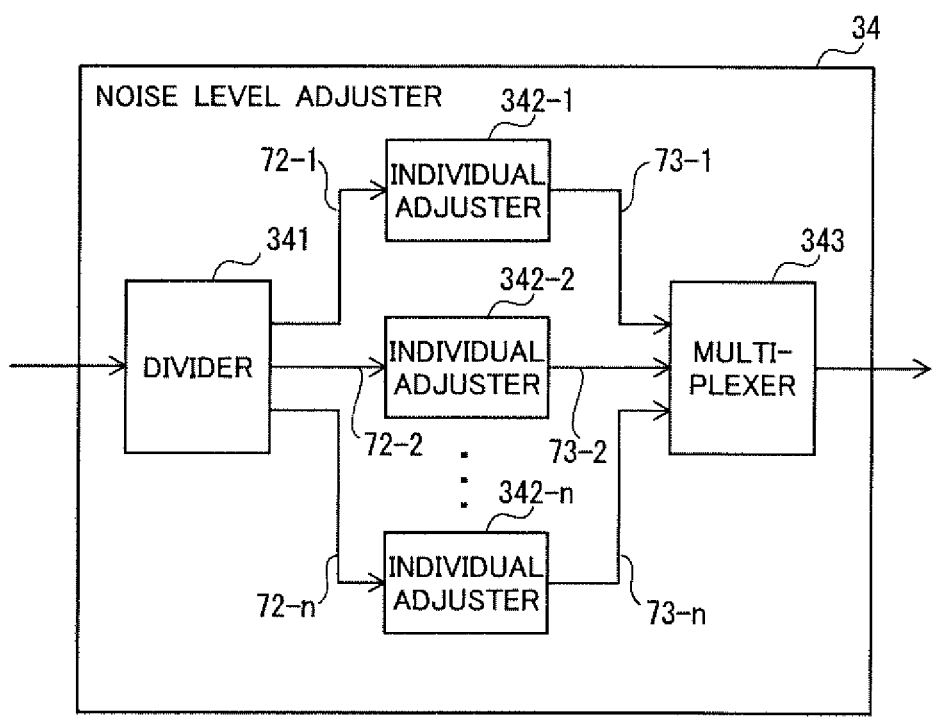
FIG. 4 is a functional block diagram illustrating a configuration of a noise level adjuster shown in FIG. 3.

FIG. 4 is a functional block diagram illustrating a configuration of the noise level adjuster 34 shown in FIG. 3. As shown in FIG. 4, the noise level adjuster 34 includes a divider 341, individual adjusters 342-1 to 342-n, and a multiplexer 343. The number n is a natural number of 2 or greater.

The divider 341 receives the estimated noise signal 61A from the noise estimator 33, and divides the received estimated noise signal 61A into a plurality of frequency bands. The estimated noise signal 61A is divided into n frequency bands. Divided noise signals 72-1, 72-2 to 72-n are generated by dividing the estimated noise signal 61A. The divider 341 outputs the generated divided noise signals 72-1 to 72-n to the individual adjusters 342-1 to 342-n, respectively.

One individual adjuster 342-k of the individual adjusters 342-1 to 342-n receives one divided noise signal 72-k of the divided noise signals 72-1 to 72-n. The individual adjuster 342-k adjusts a level of the received divided noise signal 72-k. The number k is a natural number from 1 to n. The individual adjuster 342-k outputs, to the multiplexer 343, a divided noise signal 73-k generated by adjusting the level of the received divided noise signal 72-k.

The multiplexer 343 receives, from the individual adjusters 342-1 to 342-n, the divided noise signals 73-1 to 73-n each having the adjusted level. The multiplexer 343 multiplexes the received divided noise signals 73-1 to 73-n so as to generate the adjusted noise signal 61B.

[2. Operation of the noise-reduction apparatus 13]

Figure 5:
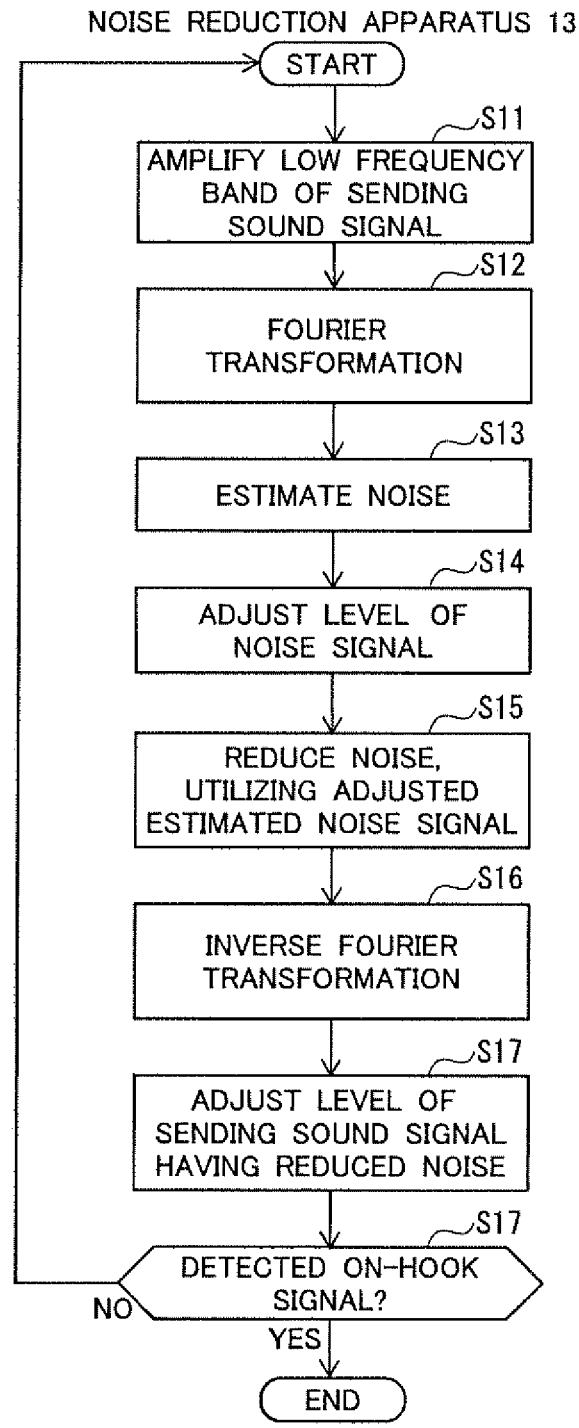
FIG. 5 is a flowchart showing an operation of the noise-reduction apparatus shown in FIG. 3.

FIG. 5 is a flowchart showing an operation of the noise-reduction apparatus 13 shown in FIG. 3. When the communication unit 14 of the handsfree apparatus 1 begins communication with the smartphone 9, the noise-reduction apparatus 13 begins a process shown in FIG. 5.

In the description below, among the noise signals included in the sending sound signal, a noise signal of 1 kHz or lower is referred to as "low frequency noise signal" and a noise signal higher than 1 kHz is referred to as "high frequency noise signal." Among the sound signals included in the sending sound signal, a sound signal of 1 kHz or lower is referred to as "low frequency sound signal" and a sound signal higher than 1 kHz is referred to as "high frequency sound signal." The sending sound signal includes the sending sound signals 53 to 54, the adjustment sending sound signal 61, and the converted sending sound signal 62.

As shown in FIG. 5, the equalizer 31 amplifies the component, in a low frequency band, (hereinafter referred to simply as "low frequency component") of the sending sound signal 53 received from the echo canceler 12 (a step S11). In this embodiment, the low frequency band is 1 kHz or lower. The component of the sending sound signal 53 in the high frequency band higher than 1 kHz is not amplified. The equalizer 31 applies a predetermined transfer function to the time domain sending sound signal 53 so as to generate the adjustment sending sound signal 61. Being similar to the sending sound signal 53, the adjustment sending sound signal 61 is the time domain signal. The equalizer 31 outputs the generated adjustment sending sound signal 61 to the Fourier transformer 32.

More specifically, the equalizer 31 amplifies the low frequency component of the sending sound signal 53 so that a frequency characteristic of the sending sound signal 53 satisfies a predetermined standard. In this embodiment, the predetermined standard is ITU-T (International Telecommunication Union-Telecommunication sector) P. 1100 or ITU-T P. 1110. The ITU-T P. 1100 and the ITU-T P. 1110 are standards for a vehicle-mounted handsfree apparatus.

Figure 6:
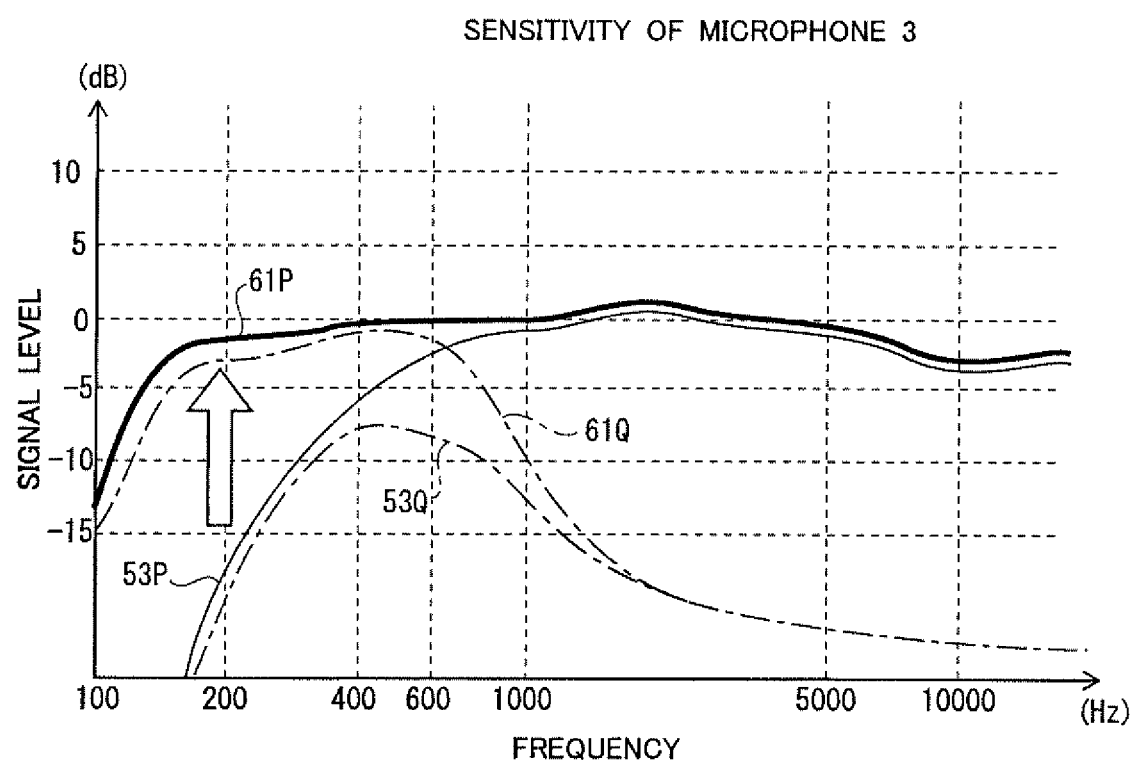
FIG. 6 is a graph showing an example of change in a frequency characteristic of a sending sound signal by an equalizer shown in FIG. 3.

FIG. 6 is a graph showing an example of a change in the frequency characteristic of the sending sound signal 53 by the equalizer 31 shown in FIG. 3. As shown in FIG. 6, a horizontal axis represents frequency and a vertical axis represents signal level. A curve 53P is a spectrum of the sending sound signal 53. A curve 53Q is a spectrum of the noise signal included in the sending sound signal 53. A curve 61P is a spectrum of the adjustment sending sound signal 61. A curve 61Q is a spectrum of the noise signal included in the adjustment sending sound signal 61.

As shown by the curve 53P, a level of the sending sound signal 53 rapidly decreases at 1 kHz and lower because the microphone 3 is a condenser microphone that is less sensitive to a sound of 1 kHz or lower. Spectrums of the sending sound signals 51 and 52 are in a similar shape to the curve 53P.

When the curve 61P is compared to the curve 53P, in the low frequency band of 1 kHz or lower, a level of the adjustment sending sound signal 61 is greater than the level of the sending sound signal 53 because the adjustment sending sound signal 61 is generated by amplifying the low frequency component of the sending sound signal 53. In the low frequency band, an amplification factor is increased as the frequency lowers. For example, the amplification factor is 5 dB for 400 Hz and 10 dB or greater for 200 Hz.

When the curve 61Q is compared to the curve 53Q, a level of the low frequency noise signal in the adjustment sending sound signal 61 is greater than a level of the low frequency noise signal in the sending sound signal 53 because the equalizer 31 amplifies not only the sound signal included in the sending sound signal 53 but also the low frequency noise signal included in the sending sound signal 53.

In the high frequency band higher than 1 kHz, the level of the adjustment sending sound signal 61 is substantially same as the level of the sending sound signal 53 because the equalizer 31 does not amplify the sending sound signal 53 in the high frequency band higher than 1 kHz.

With reference back to FIG. 5, the Fourier transformer 32 applies Fourier transformation to the adjustment sending sound signal 61 generated by the equalizer 31 (a step S12). The adjustment sending sound signal 61, the time domain signal, is converted into the frequency domain signal via Fourier transformation so as to generate the converted sending sound signal 62. The Fourier transformer 32 outputs the generated converted sending sound signal 62 to the noise estimator 33 and the noise reducer 35.

The noise estimator 33 estimates a noise included in the adjustment sending sound signal 61 based on the converted sending sound signal 62 received from the Fourier transformer 32 (a step S13). For example, a spectrum subtraction method is used for the noise estimation. As a result of the step S13, the noise estimator 33 generates the estimated noise signal 61A. The estimated noise signal 61A is the frequency domain signal. The estimated noise signal 61A is affected by amplification of the low frequency noise signal in the sending sound signal 53. In other words, the estimated noise signal 61A corresponds to the curve 61Q showing the spectrum of the noise signal included in the adjustment sending sound signal 61.

The noise estimator 33 outputs, to the noise level adjuster 34, the estimated noise signal 61A generated in the step S13. The noise level adjuster 34 adjusts the level of the estimated noise signal 61A received from the noise estimator 33 (a step S14). As a result of the step S14, the adjusted noise signal 61B is generated from the estimated noise signal 61A.

More specifically, in the noise level adjuster 34, the divider 341 divides the estimated noise signal 61A by 200 Hz to generate the banded noise signals 72-1 to **72-*n*. In this embodiment, the divider 341 is a comb filter. The divider 341 outputs, to the individual adjusters 342-1 to 342-*n*, the generated banded noise signals 72-1 to 72-*n*, respectively. The individual adjusters 342-1 to 342-*n* adjust the levels of the banded noise signals 72-1 to 72-*n*, respectively, based on weighting factors set for the individual adjusters 342-1 to 342-*n***.

Figure 7:
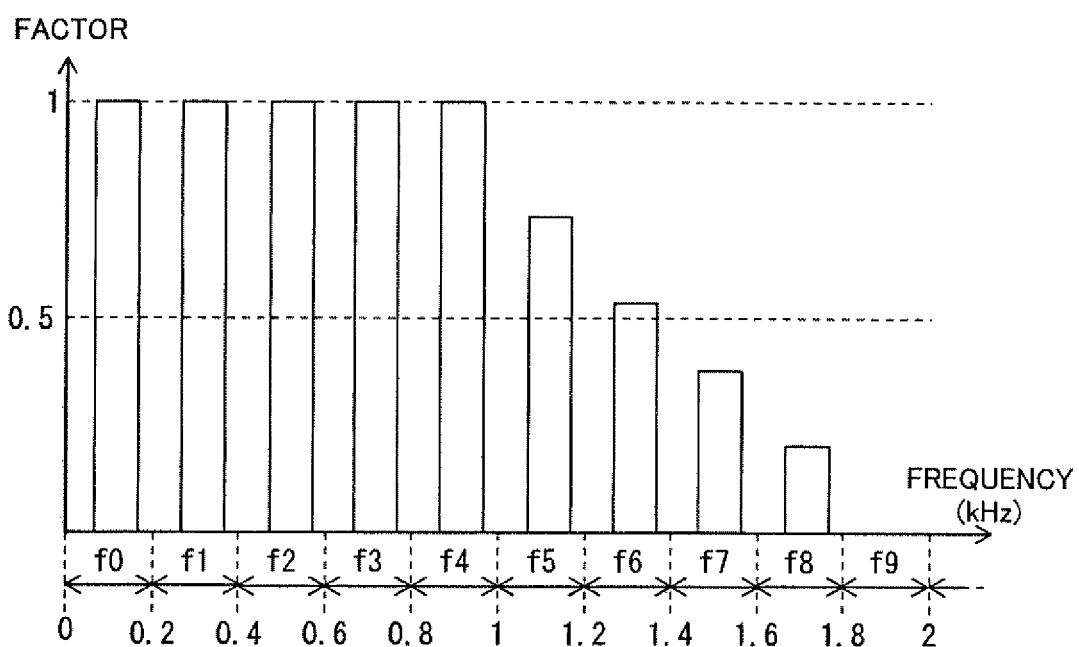
FIG. 7 illustrates an example of weighting factors set for an individual adjuster shown in FIG. 4.

FIG. 7 illustrates an example of the weighting factors set for the individual adjusters 342-1 to **342-*n*. As shown in FIG. 7, the weighting factors are set for frequency bands f0 to f9. Each frequency range of the frequency bands f0 to f9 is 200 Hz. In FIG. 7**, a weighting factor for 2 kHz or higher is omitted.

As shown in FIG. 7, the weighting factor of 1 is set for the frequency bands f0 to f4 corresponding to the low frequency band of 1 kHz or lower. The weighting factor smaller than 1 is set for the frequency bands f5 to f9 corresponding to the high frequency band higher than 1 kHz, and the weighting factor decreases as the frequency is higher. The weighting factor is 0 for a frequency band higher than the frequency band f9. When the weighting factor set for the individual adjuster **342-*k* is smaller than 1, the individual adjuster 342-*k* attenuates the input divided noise signal 72-*k*. The noise level adjuster 34 adjusts the estimated noise signal 61A so as to decrease the level of the estimated noise signal 61**A as the frequency is higher.

In other words, FIG. 7 illustrates that among the noises included in the adjustment sending sound signal 61, a noise in a frequency band higher than 1.8 kHz is not reduced by the noise-reduction apparatus 13. Thus, the noise-reduction apparatus 13 can prevent poor quality of the sound signal included in the sending sound signal 53. A reason for this will be described later.

The multiplexer 343 receives, from the individual adjusters 342-1 to 342-n, the divided noise signals 73-1 to 73-n each having the adjusted level. The multiplexer 343 multiplexes the received divided noise signals 73-1 to 73-n so as to generate the adjusted noise signal 61B.

With reference back to FIG. 5, the noise reducer 35 reduces the noise signal included in the converted sending sound signal 62 received from the Fourier transformer 32, utilizing the adjusted noise signal 61B received from the noise level adjuster 34 (a step S15). More specifically, the noise reducer 35 adjusts a phase of the adjusted noise signal 61B so that the adjusted noise signal 61B has a reverse phase to the phase of the converted sending sound signal 62. The noise reducer 35 adds the adjusted noise signal 61B having the adjusted phase to the converted sending sound signal 62 so as to reduce the noise signal included in the converted sending sound signal 62. As a result, the noise-reduced sending sound signal 63 is generated.

The inverse Fourier transformer 36 applies inverse Fourier transformation to the noise-reduced sending sound signal 63 received from the noise reducer 35 (a step S16). After being applied with the inverse Fourier transformation, the noise-reduced sending sound signal 63 is converted into the time domain signal, similar to the adjustment sending sound signal 61. The inverse Fourier transformer 36 outputs, to the communication unit 14, the noise-reduced sending sound signal 63 applied with the inverse Fourier transformation, as the sending sound signal 54.

As described above, the noise-reduction apparatus 13 amplifies the low frequency component of the sending sound signal 53 so as to generate the adjustment sending sound signal 61. The noise-reduction apparatus 13 generates the estimated noise signal 61A, the result of the noise estimation of the noise included in the generated adjustment sending sound signal 61. The noise-reduction apparatus 13 reduces the noise included in the adjustment sending sound signal 61, utilizing the estimated noise signal 61A. Thus, the noise-reduction apparatus 13 suppresses the noise level of the lower frequency signal included in the sending sound signal 53 better than a conventional noise-reduction apparatus. This will be described below.

Here will be described a case of a conventional noise-reduction apparatus having an equalizer 31 arranged in a later step of an inverse Fourier transformer 36 instead of in a previous step of a Fourier transformer 32.

The conventional noise-reduction apparatus amplifies a low frequency component of a sending sound signal 54 such that a frequency characteristic of the sending sound signal 54 output from the inverse Fourier transformer 36 satisfies the foregoing predetermined standard. In a case where the frequency characteristic of the sending sound signal 54 is as shown by the curve 61P in FIG. 6, an equalizer needs to use a relatively great amplification factor of 5 dB or greater to amplify the low frequency component in 1 kHz or lower of the sending sound signal 54. Since a component of a low frequency noise signal remains in the sending sound signal 54, the remaining component of the low frequency noise signal is amplified by the equalizer. As a result, an S/N ratio of the sending sound signal 54 after being amplified in the low frequency band is lower than an S/N ratio of the sending sound signal 54 before being amplified in the lower frequency.

Meanwhile, the equalizer 31 of the noise-reduction apparatus 13 amplifies the low frequency component of the sending sound signal 53 so that the adjustment sending sound signal 61 satisfies the foregoing predetermined standard. When the low frequency component of the sending sound signal 53 is amplified, the low frequency noise signal included in the sending sound signal 53 is amplified. The noise estimator 33 estimates the low frequency noise signal amplified by the equalizer 31. The noise reducer 35 reduces the low frequency noise signal included in the converted sending sound signal, utilizing the noise signal estimated by the noise estimator 33.

Since the equalizer 31 has already amplified the low frequency band of the sending sound signal 53, the noise-reduction apparatus 13 does not need to amplify the low frequency band of the sending sound signal 54 to cause the frequency characteristic of the sending sound signal 54 to satisfy the predetermined standard. In other words, an S/N ratio of the sending sound signal 54 in the low frequency band is substantially same as an S/N ratio of the noise-reduced sending sound signal 63 output from the noise reducer 35. Therefore, the noise-reduction apparatus 13 improves the S/N ration of the sending sound signal 54 better than the conventional noise-reduction apparatus.

The noise level adjuster 34 of the noise-reduction apparatus 13 weighs the estimated noise signal 61A in accordance with the frequency bands of the estimated noise signal 61A. More specifically, in the high frequency band higher than 1 kHz, an amount to be reduced from the estimated noise signal 61A increases as the frequency of the estimated noise signal 61A is higher.

Noises of a sound input to the microphone 3 tend to be fewer as a frequency of the sound is higher. Thus, the noise-reduction apparatus 13 reduces the level of the estimated noise signal 61A so as to prevent distortion of the sound signal in the high frequency band higher than 1 kHz or higher. Thus, the noise-reduction apparatus 13 can prevent poor quality of the sound.

<Modifications>

In the foregoing embodiment, the handsfree apparatus 1 includes the noise-reduction apparatus 13. However, a noise-reduction apparatus 13 may be mounted on a device other than the handsfree apparatus 1. For example, a voice recognition apparatus may include a noise-reduction apparatus 13. In this case, the noise-reduction apparatus 13 converts an analog sending sound signal input from a microphone 3 to a digital sending sound signal, and cancels a noise included in the converted sending sound signal. In a case where the voice recognition apparatus is used as a sound input interface for operating a navigation system mounted on a vehicle, the noise-reduction apparatus 13 improves an accuracy of voice recognition. An ICC (in car communication) apparatus or another audio device may include the noise-reduction apparatus 13. In other words, an apparatus, a device, or a unit that includes the noise-reduction apparatus 13 is not limited.

A noise-reduction apparatus 13 may be used as an active noise canceler. In this case, a noise level adjuster 34 includes a speaker that outputs an adjusted noise signal 61B as a sound. In this case, the noise level adjuster 34 adjusts a phase of the adjusted noise signal 61B so that the adjusted noise signal 61B has an inverse phase to a phase of a converted sending sound signal 62. The noise level adjuster 34 outputs, from the speaker to a cabin of a vehicle, the adjusted noise signal 61B having the adjusted phase, as a sound. In this case, the noise-reduction apparatus 13 reduces a noise in the cabin of the vehicle.

In the foregoing embodiment, the noise-reduction apparatus 13 cancels a noise included in the sending sound signal generated by the microphone 3. However, the noise-reduction apparatus 13 is not limited to this. For example, a noise-reduction apparatus 13 may be used for when a radio reception apparatus adjusts a frequency characteristic of a reception signal of a radio broadcast. The noise-reduction apparatus 13 adjusts the frequency characteristic of the reception signal of the radio broadcast, and reduces a noise included in the adjusted reception signal. In other words, the noise-reduction apparatus 13 may be used to cancel a noise included in various electric signals.

In the foregoing embodiment, the noise-reduction apparatus 13 includes the noise level adjuster 34. However, the configuration is not limited to this. A noise-reduction apparatus 13 may not include the noise level adjuster 34. In this case, the noise-reduction apparatus 13 can reduce a low frequency noise signal included in a sending sound signal 53.

In the foregoing embodiment, the equalizer 31 amplifies the low frequency band of the sending sound signal 53 so that the frequency characteristic of the sending sound signal 53 satisfies the ITU-T P. 1100 standard. However, the configuration of the equalizer 31 is not limited to this. The previous description shows an example in which the equalizer 31 amplifies the low frequency band of 1 kHz or lower of the sending sound signal 53. However, the configuration of the equalizer 31 is not limited to this. The equalizer 31 may amplify a predetermined amplification frequency band of the sending sound signal 53.

In the foregoing embodiment, the noise estimator 33 uses the spectrum subtraction method to estimate a noise. However, the method that is used by the noise estimator 33 is not limited to this. A noise estimation method that is used by the noise estimator 33 is not limited.

A noise-reduction apparatus 13 may have another equalizer arranged in a later step of an inverse Fourier transformer 36 in addition to an equalizer 31.

Each of the functional blocks of the noise-reduction apparatus 13 in the foregoing embodiments may be configured as one chip by use of a semiconductor, such as an LSI. Further, a portion or all of the blocks may be configured as one chip. Here, the LSI is an example of the semiconductor. The semiconductor is referred to also as IC, system LSI, super LSI, or ultra LSI, depending on a degree of concentration.

Further, a method of the integrated circuit is not limited to the LSI. The integrated circuit may be a specific circuit or a general purpose processor. A field programmable gate array (FPGA) that is programmable after LSI production or a reconfigurable processor in which a connection between circuit cells or setting of the LSI is reconfigurable may be used.

A portion or all of the processes performed by the functional blocks of the foregoing embodiments may be performed by a program, and a portion or all of the processes performed by the functional blocks in the foregoing embodiments may be implemented by a central processing unit (CPU) of a computer. A program to perform each of the processes is stored in a memory, such as a hard disk, a ROM, etc. The program is executed after being read out to a ROM or a RAM.

The processes of the foregoing embodiments may be performed by hardware or software (including collaboration with an operating system (OS), middleware, or a predetermined library). Further, the processes of the foregoing embodiments may be performed by a combination of software and hardware.

Figure 8:
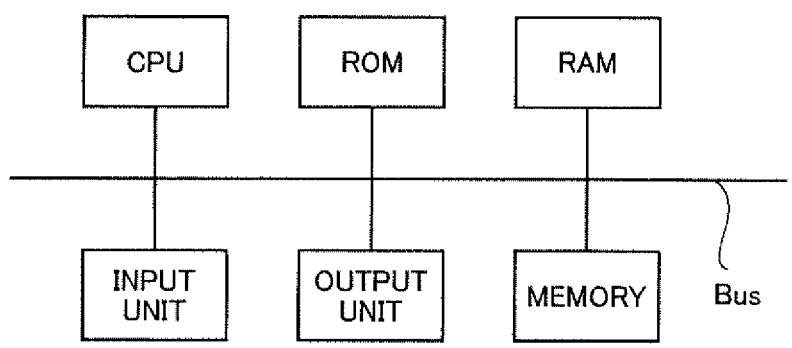
FIG. 8 illustrates a CPU bus configuration.

For example, in a case where each functional block of the foregoing embodiments (including the modifications) is executed by software, each functional block may be executed by software by use of a hardware configuration shown (e.g., the hardware configuration connecting, via bus, a CPU, a ROM, a RAM, an input unit, an output unit, etc.) in FIG. 8.

An order of performing each of the processes in the foregoing embodiments is not limited to the order described in the foregoing embodiments. The order of performing each process may be changed without departing from the purpose of the invention.

A computer program that causes a computer to perform the foregoing processes and a computer-readable recording medium that stores the computer program are included in the scope of the invention. Here, some examples of the computer-readable recording media are a flexible disk, a hard disk, a CD-ROM, a MO, a DVD, a DVD-ROM, a DVD-RAM, a large capacity DVD, a next generation DVD, and a semiconductor memory.

The computer program is not limited to a program stored in the foregoing recording medium. The computer program may be transmitted via an electrical communication line, wireless communication, a wired communication line, a network, typically the Internet, etc.

Some embodiments of the invention are described above. However, those embodiments are only examples of the invention. Therefore, the invention is not limited to those embodiments, and the embodiments and the modifications of the invention can be properly modified to implement the invention without departing from the purpose of the invention.

While the invention has been shown and described in detail, the foregoing description is in all aspects illustrative and not restrictive. It is therefore understood that numerous other modifications and variations can be devised without departing from the scope of the invention.

What is claimed is:

1. A noise-reduction apparatus comprising:
    an equalizer that amplifies a component of an input sound signal in a predetermined amplification frequency band so as to generate an adjustment signal;
    a noise estimator that estimates an acoustic noise signal included in the adjustment signal generated by the equalizer;
    a noise level adjuster that adjusts a level of the acoustic noise signal estimated by the noise estimator, in a predetermined adjustment frequency band, so as to generate an adjusted acoustic noise signal; and
    a noise reducer that reduces the acoustic noise signal included in the adjustment signal generated by the equalizer, utilizing the adjusted acoustic noise signal generated by the noise level adjuster, wherein
    the noise level adjuster:
        (i) divides the acoustic noise signal into a plurality of divided acoustic noise signals each having a different frequency band, and
        (ii) individually adjusts the level of each of the divided acoustic noise signals to generate the adjusted acoustic noise signal.

2. The noise-reduction apparatus according to claim 1, wherein
    the predetermined adjustment frequency band is higher than a predetermined frequency threshold; and the noise level adjuster reduces the acoustic noise signal in the predetermined adjustment frequency band.

3. The noise-reduction apparatus according to claim 1, further comprising
   a Fourier transformer that (i) applies Fourier transformation to the adjustment signal generated by the equalizer to convert the adjustment signal from a time domain to a frequency domain, and (ii) outputs a converted adjustment signal, which is the adjustment signal converted to the frequency domain, to the noise estimator and to the noise reducer, and
   an inverse Fourier transformer that applies inverse Fourier transformation to a noise-reduced signal output by the noise reducer to convert the noise-reduced signal from the frequency domain to the time domain.

4. The noise-reduction apparatus according to claim 1, further comprising
   a microphone that generates the sound signal.

5. The noise-reduction apparatus according to claim 1, wherein the noise level adjuster adjusts the level of at least some of the divided acoustic noise signals by a first amount that is different from a second amount by which the level of other ones of the divided acoustic noise signals is adjusted.

6. The noise-reduction apparatus according to claim 1, wherein each of the different frequency bands of the divided acoustic noise signals has a predetermined bandwidth.

7. A noise-reduction method comprising the steps of:
   amplifying a component of an input sound signal in a predetermined amplification frequency band so as to generate an adjustment signal;
   estimating an acoustic noise signal included in the adjustment signal that was generated;
   adjusting a level of the acoustic noise signal that was estimated, in a predetermined adjustment frequency band, so as to generate an adjusted acoustic noise signal; and
   reducing the acoustic noise signal included in the adjustment signal that was generated, utilizing the adjusted acoustic noise signal, wherein
   the adjusting the level of the acoustic noise signal includes:
   (i) dividing the acoustic noise signal into a plurality of divided acoustic noise signals each having a different frequency band, and
   (ii) individually adjusting the level of each of the divided acoustic noise signals to generate the adjusted acoustic noise signal.

8. The noise-reduction method according to claim 7, wherein
   the predetermined adjustment frequency band is higher than a predetermined frequency threshold; and
   the adjusting of the level of the acoustic noise signal reduces the acoustic noise signal in the predetermined adjustment frequency band.

9. The noise-reduction method according to claim 7, further comprising
   applying Fourier transformation to the adjustment signal that was generated to convert the adjustment signal from a time domain to a frequency domain, to generate a converted adjustment signal, which is used in the estimating step to estimate the noise signal, and which is reduced in the reducing step; and
   applying inverse Fourier transformation to a noise-reduced signal output by the reducing step to convert the noise-reduced signal from the frequency domain to the time domain.

10. The noise-reduction method according to claim 7, wherein
    the sound signal is generated by a microphone.

11. The noise-reduction method according to claim 7, wherein the level of at least some of the divided acoustic noise signals is adjusted by a first amount that is different from a second amount by which the level of other ones of the divided acoustic noise signals is adjusted.

12. The noise-reduction method according to claim 7, wherein each of the different frequency bands of the divided acoustic noise signals has a predetermined bandwidth.

* * * * *